US010503685B2

(12) United States Patent
Dohi

(10) Patent No.: US 10,503,685 B2
(45) Date of Patent: Dec. 10, 2019

(54) SEMICONDUCTOR MEMORY DEVICE

(71) Applicant: Toshiba Memory Corporation, Minato-ku (JP)

(72) Inventor: Masayuki Dohi, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 578 days.

(21) Appl. No.: 15/252,417

(22) Filed: Aug. 31, 2016

(65) Prior Publication Data
US 2017/0257960 A1 Sep. 7, 2017

Related U.S. Application Data

(60) Provisional application No. 62/303,670, filed on Mar. 4, 2016.

(51) Int. Cl.
*G06F 13/42* (2006.01)
*H05K 5/02* (2006.01)
*H05K 7/20* (2006.01)

(52) U.S. Cl.
CPC ........ *G06F 13/4282* (2013.01); *H05K 5/0278* (2013.01); *H05K 7/2039* (2013.01); *G06F 2213/0042* (2013.01)

(58) Field of Classification Search
CPC ...... H05K 5/02; H05K 5/0278; H05K 7/2039; G06F 1/203; G06F 13/4282; G06F 2213/0042; G06F 2213/004
See application file for complete search history.

(56) References Cited

U.S. PATENT DOCUMENTS

| 7,049,099 | B2 | 5/2006 | Wakamiya | |
| 7,259,967 | B2 | 8/2007 | Ni | |
| 8,014,130 | B1 * | 9/2011 | Nguyen | H01R 13/447 361/600 |
| 2011/0228467 | A1 * | 9/2011 | Mitsuhashi | H05K 1/117 361/679.32 |

* cited by examiner

*Primary Examiner* — Dimary S Lopez Cruz
*Assistant Examiner* — Ingrid D Wright
(74) *Attorney, Agent, or Firm* — Oblon, McClelland, Maier & Neustadt, L.L.P.

(57) ABSTRACT

According to one embodiment, a semiconductor memory device includes a first tube, a case, a substrate, a memory, a controller, and a first layer. The case is connected to the first tube. The substrate includes a first portion inside the first tube. The first layer covers an inner face of the first tube, is interposed between the first portion and the first tube, and has a thermal conductivity higher than a thermal conductivity of the first tube.

20 Claims, 8 Drawing Sheets

SEMICONDUCTOR MEMORY DEVICE

CROSS-REFERENCE TO RELATED APPLICATIONS

This application is based upon and claims the benefit of priority from U.S. Provisional Application No. 62/303,670, filed on Mar. 4, 2016; the entire contents of which are incorporated herein by reference.

FIELD

Embodiments described herein relate generally to a semiconductor memory device.

BACKGROUND

A device such as a semiconductor memory device includes a connector that connects the device and other devices. For example, the connector includes a tube and an electrode in the tube.

DETAILED DESCRIPTION

In general, according to one embodiment, there is provided a semiconductor memory device comprising: a first tube; a case which is connected to the first tube; a substrate which includes a first portion inside the first tube, on which an electrode is mounted, and a second portion inside the case; a memory which is mounted on the substrate; a controller which is mounted on the substrate and is configured to control the memory; and a first layer which covers at least a portion of an inner face of the first tube, is interposed between the first portion and the first tube, and has a thermal conductivity higher than a thermal conductivity of the first tube.

Exemplary embodiments of a semiconductor memory device will be explained below in detail with reference to the accompanying drawings. The present invention is not limited to the following embodiments.

First Embodiment

A first embodiment is described below with reference to FIGS. 1 to 5. In the present specification, constituent elements according to the embodiments and descriptions of these elements may be expressed as being plural. As for the constituent elements expressed as being plural and descriptions thereof, expressions other than those actually described in the present specification can be also applied. Further, as for constituent elements not expressed as being plural and descriptions thereof, expressions other than those actually described in the present specifications can be also applied.

Figure 1:
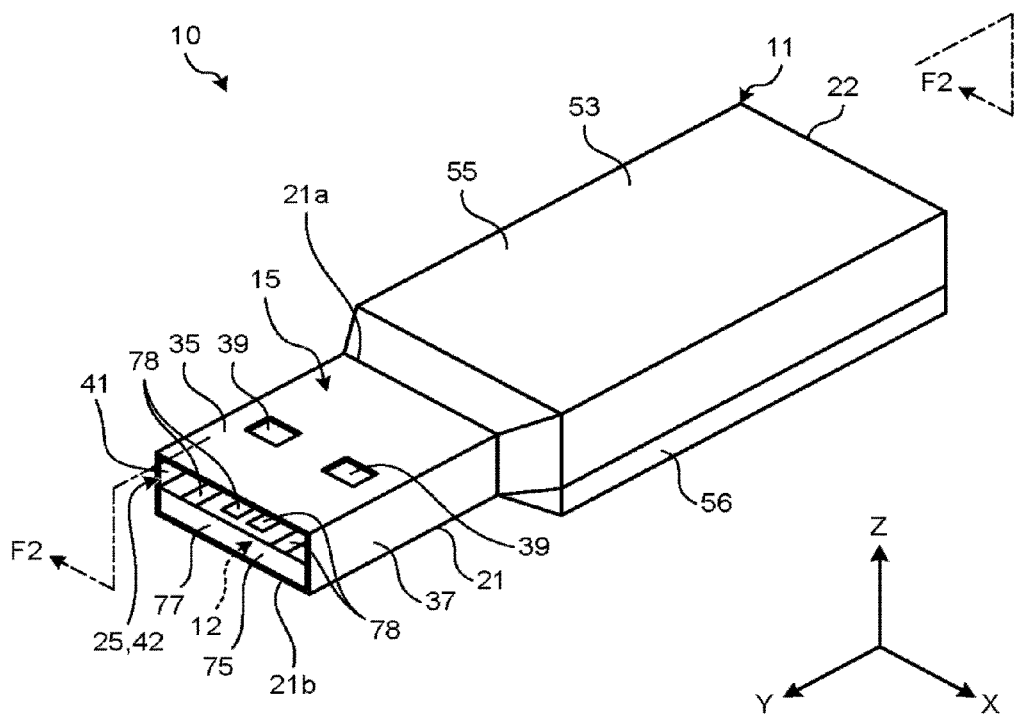
FIG. 1 is a perspective view illustrating a USB drive according to a first embodiment.

FIG. 1 is a perspective view illustrating a USB flash drive (hereinafter, "USB drive") 10 according to the first embodiment. The USB drive 10 is an example of a semiconductor memory device, and can be also referred to as, for example, a semiconductor device, a memory device, an auxiliary memory device, a removable medium, an electronic device, or a device. The semiconductor memory device may be, for example, a portable computer, a tablet, a television receiver, a display, a smartphone, a portable phone, an IC recorder, consumer electronics, or an auxiliary memory device such as a hybrid hard disk drive (HDD) or a solid state drive (SSD) that includes a semiconductor memory, or another device.

As illustrated in the drawings, an X-axis, a Y-axis, and a Z-axis are defined in the present specification. The X-axis, the Y-axis, and the Z-axis are mutually perpendicular. The X-axis lies along the width of the USB drive 10. The Y-axis lies along the length of the USB drive 10. The Z-axis lies along the thickness of the USB drive 10.

Figure 2:
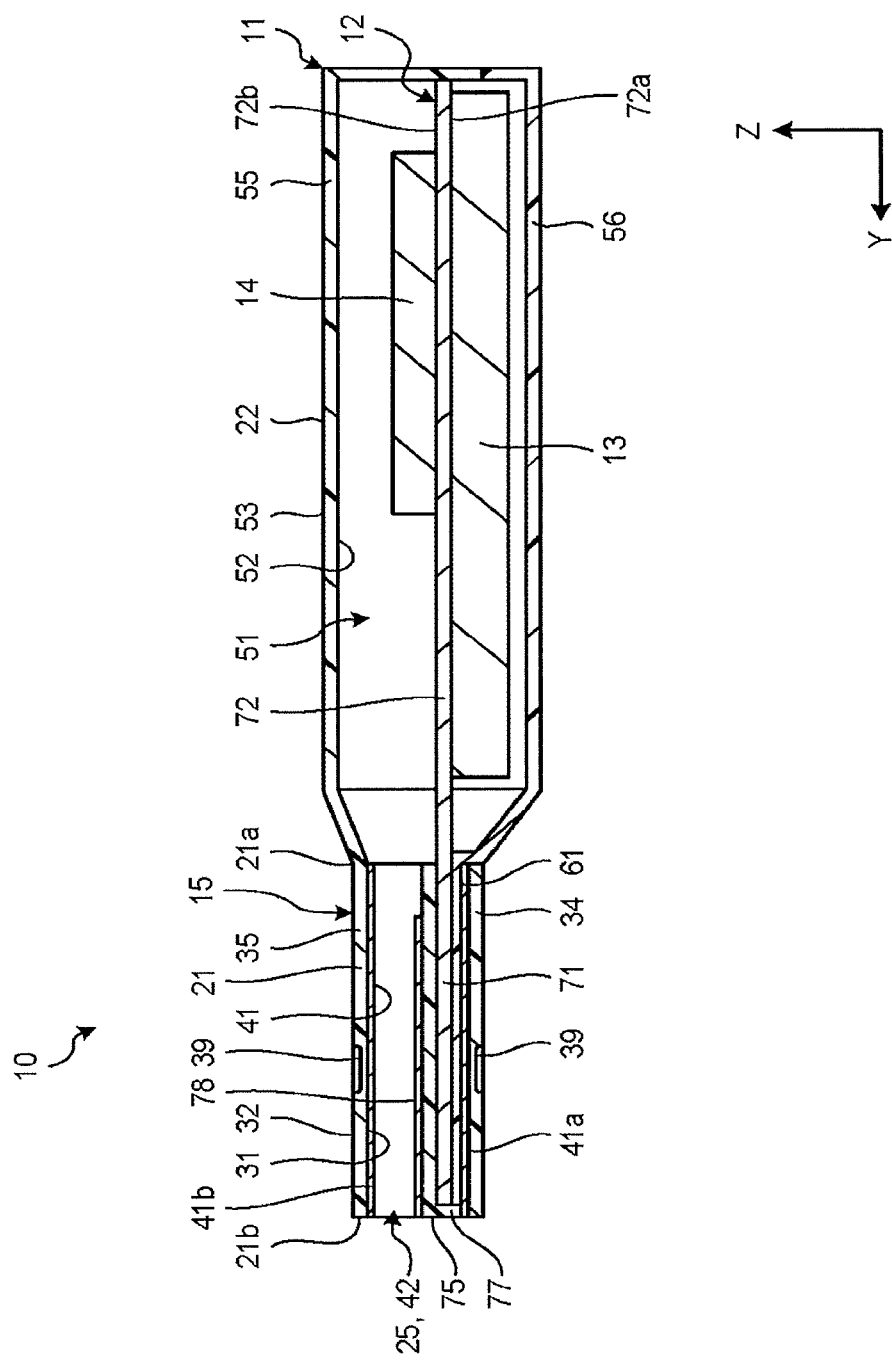
FIG. 2 is a cross-sectional view illustrating the USB drive of the first embodiment, taken along a line F2-F2 in FIG. 1.

FIG. 2 is a cross-sectional view illustrating the USB drive 10 of the first embodiment, taken along a line F2-F2 in FIG. 1. The USB drive 10 includes a housing 11, a substrate 12, a flash memory 13, and a controller 14.

The flash memory 13 is an example of a memory, and can be also referred to as, for example, a non-volatile memory, a memory unit, or an electronic component. The controller 14 can be also referred to as, for example, a control unit or an electronic component.

The USB drive 10 further includes a plug 15. The plug 15 is an example of a connector and a USB connector, and can be also referred to as, for example, an insertion portion or a connection portion. The plug 15 according to the present embodiment is a male connector conforming to the Universal Serial Bus (USB) 3.0 Type-A standard. The plug 15 may conform to other standards such as the USB 3.1 standard or the USB 2.0 standard.

In the present embodiment, the housing 11 is made of synthetic resin. The synthetic resin is an example of a first material and resin. The housing 11 is made of ABS resin or polycarbonate, for example.

The housing 11 may be made of natural resin, metal, ceramic, or other materials, and may include a portion made of natural resin, metal, ceramic, or other materials. The resin includes synthetic resin and natural resin.

The housing 11 includes a shell 21 and a case 22. The shell 21 is an example of a first tube and a tube, and can be also referred to as, for example, a hollow cylinder, a wall, or a covering portion. The case 22 can be also referred to as, for example, a housing or a cover. The shell 21 and the case 22 of the housing 11 are made of synthetic resin that is mutually the same material. In other words, each of the shell 21 and the case 22 is made of resin.

The shell 21 is formed integrally with the case 22. In other words, the shell 21 is continuous with the case 22. The shell 21 extends from the case 22 in a positive direction along the Y-axis (a direction indicated by an arrow of the Y-axis). In other words, the case 22 is connected to the shell 21.

Figure 3:
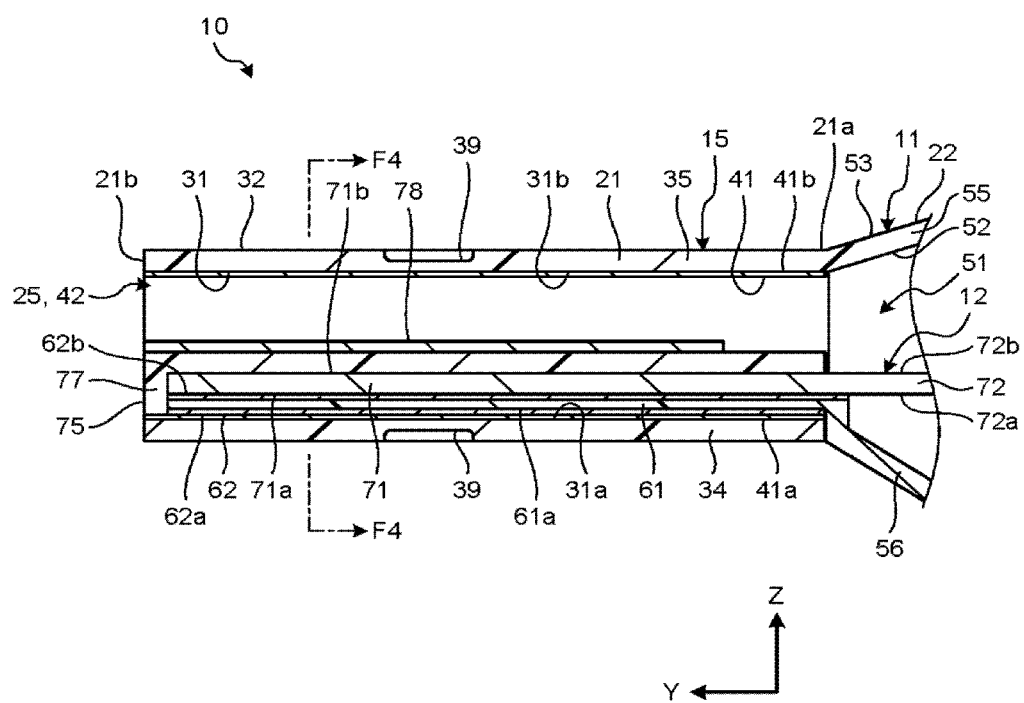
FIG. 3 is a cross-sectional view illustrating a portion of the USB drive of the first embodiment.
Figure 4:
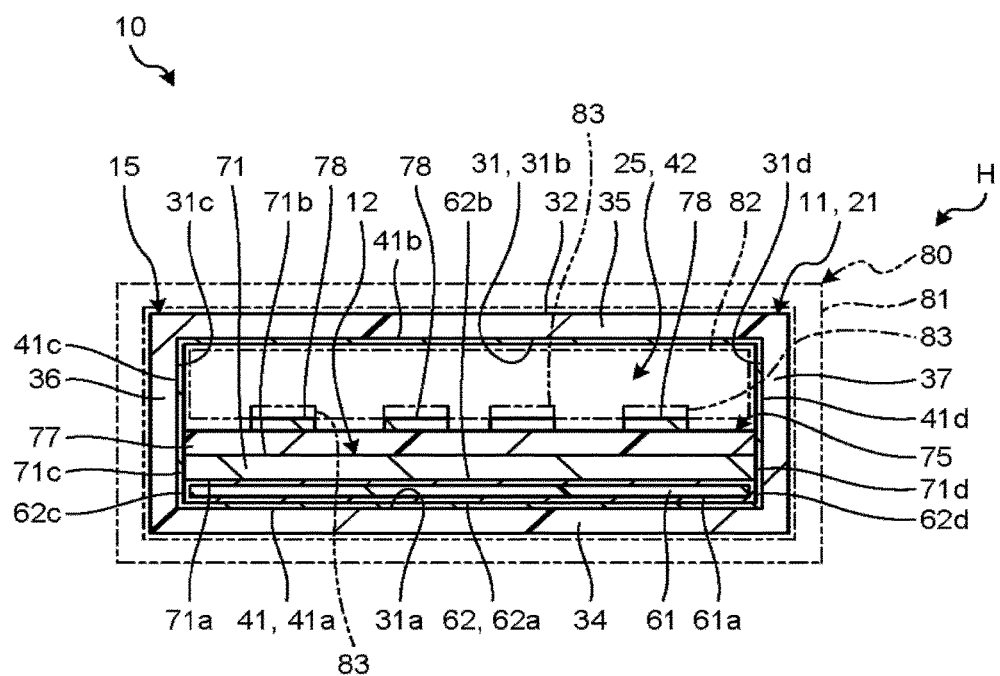
FIG. 4 is a cross-sectional view illustrating the USB drive of the first embodiment, taken along a line F4-F4 in FIG. 3.

FIG. 3 is a cross-sectional view illustrating a portion of the USB drive 10 of the first embodiment. FIG. 4 is a cross-sectional view illustrating the USB drive 10 of the first embodiment, taken along a line F4-F4 in FIG. 3. As illustrated in FIG. 4, the shell 21 is a substantially quadrangular hollow tube. In other words, the shell 21 has a substantially cuboidal shape and is provided with an opening 25 extending in a direction along the Y-axis. The shell 21 may have other shapes.

As illustrated in FIG. 3, the shell 21 includes a base end portion 21a and a tip end portion 21b. The base end portion 21a is an example of a first end portion. The tip end portion 21b is an example of a second end portion. The base end portion 21a is one end portion of the shell 21 in the direction along the Y-axis and is connected to the case 22. The tip end portion 21b is the other end portion of the shell 21 in the direction along the Y-axis and is positioned on the opposite side of the base end portion 21a in the direction along the Y-axis. The direction along the Y-axis is an example of a direction from a second portion towards a first portion.

The opening 25 extends from the base end portion 21a of the shell 21 towards the tip end portion 21b to pass through the shell 21. In other words, the opening 25 is open to the base end portion 21a and is also open to the tip end portion 21b. The opening 25 is open to the outside of the shell 21.

The shell 21 has an inner circumferential face 31 and an outer circumferential face 32. The inner circumferential face 31 is an example of an inner face of the first tube and an inner face of the tube. The inner circumferential face 31 forms the opening 25. In other words, the inner circumferential face 31 faces the opening 25. The outer circumferential face 32 is positioned on the opposite side of the inner circumferential face 31.

As illustrated in FIG. 4, the inner circumferential face 31 has a first face 31a, a second face 31b, a third face 31c, and a fourth face 31d. Each of the first to fourth faces 31a, 31b, 31c, and 31d is formed to be substantially flat. Each of the first to fourth faces 31a, 31b, 31c, and 31d may be a curved face or a face having concavity and convexity, for example.

The first face 31a faces a positive direction along the Z-axis (a direction indicated by an arrow of the Z-axis). The second face 31b is away from the first face 31a in the positive direction along the Z-axis and faces to a negative direction along the Z-axis (an opposite direction to the direction indicated by the arrow of the Z-axis). In other words, the second face 31b faces the first face 31a.

The third face 31c connects one end of the first face 31a and one end of the second face 31b to each other in a direction along the X-direction. The third face 31c faces a positive direction along the X-axis (a direction indicated by an arrow of the X-axis). The fourth face 31d connects the other end of the first face 31a and the other end of the second face 31b in the direction along the X-axis. The fourth face 31d is away from the third face 31c in the positive direction along the X-axis and faces to a negative direction along the X-axis (an opposite direction to the direction indicated by the arrow of the X-axis). In other words, the fourth face 31d faces the third face 31c.

The shell 21 has a first wall 34, a second wall 35, a third wall 36, and a fourth wall 37. The first wall 34 is a portion of the shell 21 and has the first face 31a of the inner circumferential face 31. The second wall 35 is a portion of the shell 21 and has the second face 31b. The third wall 36 is a portion of the shell 21 and has the third face 31c. The fourth wall 37 is a portion of the shell 21 and has the fourth face 31d.

The third wall 36 connects one end portion of the first wall 34 and one end portion of the second wall 35 to each other in the direction along the X-axis. The fourth wall 37 connects the other end portion of the first wall 34 and the other end portion of the second wall 35 to each other in the direction along the X-axis.

As illustrated in FIG. 3, the outer circumferential face 32 of the shell 21 is provided with a plurality of depressions 39. For example, two depressions 39 are provided in the first wall 34, and other two depressions 39 are provided in the second wall 35. The two depressions 39 in the first wall 34 are arranged in the direction along the X-axis. The two depressions 39 in the second wall 35 are also arranged in the direction along the X-axis.

At least a portion of the inner circumferential face 31 of the shell 21 is covered by a first coating 41. The first coating 41 is an example of a first layer, a second tube, and a layer, and can be also referred to as, for example, a film, a wall, a surface, a cover, a member, and a portion.

For example, the first coating 41 is made of plating of metal such as nickel, copper, or chrome. In other words, the first coating 41 is made of metal. Metal is an example of a second material. That is, the thermal conductivity of a material of the first coating 41 is higher than the thermal conductivity of a material of the shell 21. In other words, the first coating 41 has a higher thermal conductivity than the thermal conductivity of the shell 21.

The first coating 41 may be made of other material such as other metal, resin, or ceramic. For example, the first coating 41 may be a metal sleeve or a tube formed in advance by various types of methods such as casting or forging. The first coating 41 may be painting including metal.

The first coating 41 is a substantially quadrangular hollow tube. In other words, the first coating 41 has a substantially cuboidal shape and is provided with an inner opening 42 extending in the direction along the Y-axis. The first coating 41 may have other shapes.

For example, the first coating 41 is produced on the inner circumferential face 31 of the shell 21 by electroless plating. Therefore, the first coating 41 is made to adhere on the inner circumferential face 31 of the shell 21. In other words, the first coating 41 is held by the shell 21. Further, the first coating 41 is thinner than the shell 21. The first coating 41 may be formed by other methods such as electrolytic plating, and may have a portion thicker than a portion of the shell 21.

As illustrated in FIG. 4, the first coating 41 has a first covering portion 41a, a second covering portion 41b, a third covering portion 41c, and a fourth covering portion 41d. The first covering portion 41a covers the first face 31a of the inner circumferential face 31. The second covering portion 41b covers the second face 31b. The third covering portion 41c covers the third face 31c. The fourth covering portion 41d covers the fourth face 31d.

The third covering portion 41c connects one end portion of the first covering portion 41a and one end portion of the second covering portion 41b to each other in the direction along the X-axis. The fourth covering portion 41d connects the other end portion of the first covering portion 41a and the other end portion of the second covering portion 41b to each other in the direction along the X-axis. In this manner, the first to fourth covering portions 41a, 41b, 41c, and 41d are mutually connected to form a substantially quadrangular hollow tube.

At least one of the first to fourth covering portions 41a, 41b, 41c, and 41d may have a plurality of portions separate from each other. The first to fourth covering portions 41a, 41b, 41c, and 41d may be away from each other. It is also possible that at least one of the first to fourth faces 31a, 31b, 31c, and 31d is not covered by the first to fourth covering portions 41a, 41b, 41c, and 41d.

The first coating 41 illustrated in FIG. 3 is slightly away from the tip end portion 21b of the shell 21. In this manner, the first coating 41 partly covers the inner circumferential face 31 of the shell 21. In the present embodiment, the tip end portion 21b is exposed without being covered by the first coating 41.

As illustrated in FIG. 2, the case 22 is formed to have a substantially cuboidal box shape. A space 51 is provided inside the case 22. The space 51 can be also referred to as an accommodation portion or a chamber. The space 51 is connected to the opening 25 of the shell 21. The space 51 is opened to the outside of the USB drive 10 through the opening 25.

The case 22 has an inner face 52 and an outer face 53. The inner face 52 forms the space 51. In other words, the inner face 52 faces the space 51. The outer face 53 is positioned on the opposite side of the inner face 52. As described above, the case 22 having the outer face 53 is formed integrally with the shell 21.

The case 22 has a first cover 55 and a second cover 56. The first cover 55 and the second cover 56 are fixed to each other by a method such as snap fitting to form the case 22, for example. The first cover 55 and the second cover 56 may be screwed to each other or attached to each other by other techniques such as ultrasonic welding.

For example, the first cover 55 is formed to have a box shape that is open to the negative direction along the Z-axis. The shell 21 is connected to an end portion of the first cover 55 in the positive direction along the Y-axis. That is, the first cover 55 is formed integrally with the shell 21.

More specifically, the first cover 55 is connected to the second wall 35, the third wall 36, and the fourth wall 37 of the shell 21. The first wall 34 of the shell 21 is away from the first cover 55.

For example, the second cover 56 is formed to have a box shape that is open to the positive direction along the Z-axis. When the second cover 56 is attached to the first cover 55, the case 22 is formed and the space 51 surrounded by the case 22 is also formed. In other words, the second cover 56 closes the space 51 by being attached to the first cover 55.

A plate-like projection 61 extends from the second cover 56. In other words, the projection 61 is connected to the second cover 56. The projection 61 is an example of a member and can be also referred to as, for example, an interposed portion, a wall, or a portion. It is also possible that the projection 61 is not provided in the second cover 56.

The projection 61 is formed to have a plate shape extending along the Y-axis from the end portion in the positive direction along the Y-axis of the second cover 56. The projection 61 is arranged in the opening 25 of the shell 21 and is adjacent to the first face 31a of the inner circumferential face 31.

As illustrated in FIG. 4, at least a portion of the projection 61 is covered by a second coating 62. The second coating 62 is an example of a second layer, and can be also referred to as, for example, a film, a wall, a surface, a cover, a member, and a portion.

For example, the second coating 62 is made of plating of metal such as nickel, copper, or chrome. Metal is an example of a third material. That is, the thermal conductivity of a material of the second coating 62 is higher than the thermal conductivity of the material of the shell 21. In other words, the second coating 62 has a higher thermal conductivity than the thermal conductivity of the shell 21.

The second coating 62 may be made of other material such as other metal, resin, or ceramic. For example, the second coating 62 may be a metal sleeve or a tube formed in advance by various types of methods such as casting or forging. The second coating 62 may be painting including metal.

The second coating 62 is a substantially quadrangular hollow tube. In other words, the second coating 62 has a substantially cuboidal shape with a hole extending therethrough in the direction along the Y-axis. The projection 61 is arranged in this hole.

For example, the second coating 62 is produced on a surface 61a of the projection 61 by electroless plating. Therefore, the second coating 62 is made to adhere on the surface 61a of the projection 61. Further, the second coating 62 is thinner than the projection 61. The second coating 62 may be formed by other methods such as electrolytic plating, and may have a portion thicker than a portion of the projection 61.

The second coating 62 has a first contact portion 62a, a second contact portion 62b, a third contact portion 62c, and a fourth contact portion 62d. Each of the first contact portion 62a, the third contact portion 62c, and the fourth contact portion 62d is an example of a first contact portion. The first contact portion 62a is in contact with the first covering portion 41a of the first coating 41. The second contact portion 62b is positioned on the opposite side of the first contact portion 62a.

The third contact portion 62c connects one end of the first contact portion 62a and one end of the second contact portion 62b to each other in the direction along the X-axis. The second contact portion 62b is thermally connected to the first contact portion 62a via the third contact portion 62c. The third contact portion 62c is in contact with the third covering portion 41c of the first coating 41.

The fourth contact portion 62d connects the other end of the first contact portion 62a and the other end of the second contact portion 62b to each other in the direction along the X-axis. The second contact portion 62b is thermally connected to the first contact portion 62a via the fourth contact portion 62d. The fourth contact portion 62d is in contact with the fourth covering portion 41d.

As described above, the first contact portion 62a, the third contact portion 62c, and the fourth contact portion 62d of the second coating 62 are in contact with the first coating 41 and is thermally connected to the first coating 41. In other words, a portion of the second coating 62 is in contact with the first coating 41.

As illustrated in FIG. 3, an end portion of the second cover 56 in the positive direction along the Y-axis is in contact with an end portion of the first wall 34 of the shell 21 in a negative direction along the Y-axis (an opposite direction to the direction indicated by the arrow of the Y-axis). Further, the projection 61 extends along the first wall 34 from the end portion of the second cover 56 in the positive direction along the Y-axis, and is inserted into the opening 25. The projection 61 is provided to close a gap between the second cover 56 and the first wall 34.

In the direction along the Z-axis, the first cover 55 projects from the outer circumferential face 32 of the shell 21 in the positive direction. In the direction along the Z-axis, the second cover 56 projects from the outer circumferential face 32 of the shell 21 in the negative direction. The second cover 56 projects more largely than the first cover 55. In other words, in the direction along the Z-axis, a distance between the outer circumferential face 32 of the shell 21 and an apex of the second cover 56 is longer than a distance between the outer circumferential face 32 of the shell 21 and an apex of the first cover 55.

The substrate 12 is a printed circuit board (PCB). The substrate 12 may be another substrate. The substrate 12 has a terminal portion 71 and a mounting portion 72. The terminal portion 71 is an example of a first portion. The mounting portion 72 is an example of a second portion.

The terminal portion 71 is a portion of the substrate 12, the portion being positioned inside the shell 21. In other words, the terminal portion 71 is arranged in the opening 25 of the shell 21. As illustrated in FIG. 4, the terminal portion 71 has a first surface 71a, a second surface 71b, a third surface 71c, and a fourth surface 71d.

The first surface 71a faces the projection 61. The projection 61 is interposed between the terminal portion 71 of the substrate 12 and the first coating 41. The first surface 71a is in contact with the second contact portion 62b of the second coating 62. The first surface 71a may be in contact with the first covering portion 41a of the first coating 41.

The second surface 71b is positioned on the opposite side of the first surface 71a. The second surface 71b is opposed to the second face 31b of the inner circumferential face 31 of the shell 21 and is away from the second face 31b. The second surface 71b is also away from the second covering portion 41b.

The third surface 71c connects, in the direction along the X-direction, one end of the first surface 71a and one end of the second surface 71b to each other. The third surface 71c is in contact with the third covering portion 41c of the first coating 41. In other words, a portion of the first coating 41 is in contact with the terminal portion 71.

The fourth surface 71d connects, in the direction along the X-direction, the other end of the first surface 71a and the other end of the second surface 71b to each other. The fourth surface 71d is in contact with the fourth covering portion 41d of the first coating 41.

As described above, the terminal portion 71 of the substrate 12 is in contact with the third covering portion 41c and the fourth covering portion 41d of the first coating 41 and are thermally connected to them. In other words, a portion of the terminal portion 71 is in contact with the first coating 41. Further, the terminal portion 71 is thermally connected to the first coating 41 via the second coating 62.

The first covering portion 41a of the first coating 41 is interposed between the terminal portion 71 of the substrate 12 and the inner circumferential face 31 of the shell 21. Each of the third covering portion 41c and the fourth covering portion 41d is also interposed between the terminal portion 71 of the substrate 12 and the inner circumferential face 31 of the shell 21. It suffices that the first coating 41 interposed between the terminal portion 71 and the inner circumferential face 31 is positioned between the terminal portion 71 and the inner circumferential face 31.

A terminal unit 75 is mounted on the second surface 71b of the terminal portion 71. The terminal unit 75 is an example of an electrode. The terminal unit 75 includes a colored portion 77 and a plurality of terminals 78. The colored portion 77 is a blue member made of synthetic resin, for example. The colored portion 77 covers the second surface 71b and an end portion of the terminal portion 71, for example. Instead of the colored portion 77, for example, the projection 61 may cover the end portion of the terminal portion 71. The terminals 78 are an example of the electrode.

The plurality of terminals 78 are made of a conductor such as metal. The terminals 78 according to the present embodiment are terminals of the USB 3.0 Type-A standard. The colored portion 77 and the terminals 78 are manufactured by insert molding, for example. The plurality of terminals 78 are electrically connected to pads on the terminal portion 71, for example, by soldering. The plurality of terminals 78 are opposed to the second covering portion 41b.

The terminal unit 75 conforming to the USB 3.0 Type-A standard has nine terminals 78. However, for understanding, each of the drawings illustrates four terminals 78. For example, the terminal unit 75 conforming to the USB 2.0 Type-A standard has four terminals 78.

The plug 15 includes the shell 21, the first coating 41, the projection 61 of the second cover 56, the terminal portion 71 of the substrate 12, and the terminal unit 75. For example, the plug 15 is configured to be inserted into a socket 80 of a host device H illustrated with a dashed double-dotted line in FIG. 4.

The socket 80 is a female connector conforming to the USB 3.0 Type-A standard. In other words, the socket 80 conforms to the USB standard. The socket 80 may be a female connector conforming to the USB 2.0 standard, the USB 3.1 standard, or other standards.

The socket 80 is mounted on the host device H, such as a portable computer, a tablet, a television receiver, a display, a smartphone, a portable phone, or consumer electronics. The socket 80 includes a socket shell 81 and a socket terminal portion 82.

When the plug 15 is inserted into the socket 80, the socket shell 81 surrounds the shell 21 of the plug 15. For example, the socket shell 81 has a spring insertable into the depression 39 of the shell 21. By means of this spring, the socket shell 81 holds the shell 21.

The socket terminal portion 82 is arranged inside the socket shell 81. When the plug 15 is inserted into the socket 80, the socket terminal portion 82 is inserted between the terminal portion 71 of the substrate 12 and the second wall 35 of the shell 21. The socket terminal portion 82 includes a plurality of terminals 83. The plurality of terminals 83 of the socket terminal portion 82 are in contact with the plurality of terminals 78 of the plug 15 and are electrically connected to the terminals 78. Due to this configuration, the USB drive 10 is electrically connected to the host device H via the plug 15 and the socket 80.

As illustrated in FIG. 2, the mounting portion 72 of the substrate 12 is positioned inside the case 22. In other words, the mounting portion 72 is arranged in the space 51 of the case 22. The inner face 52 of the case 22 faces the mounting portion 72. A portion of the mounting portion 72 may be arranged inside the shell 21. For example, an area of contact between the case 22 and the mounting portion 72 is set to be small.

The mounting portion 72 has a first mounting face 72a and a second mounting face 72b. The first mounting face 72a is continuous from the first surface 71a of the terminal portion 71. The second mounting face 72b is continuous from the second surface 71b of the terminal portion 71. The second mounting face 72b is positioned on the opposite side of the first mounting face 72a. The first mounting face 72a faces the second cover 56. The second mounting face 72b faces the first cover 55.

The flash memory 13 is mounted on the first mounting face 72a of the mounting portion 72. For example, a plurality of terminals of the flash memory 13 are electrically connected to a plurality of pads on the first mounting face 72a by soldering. The flash memory 13 may be mounted on the second mounting face 72b. A plurality of flash memories 13 may be mounted on both the first mounting face 72a and the second mounting face 72b.

The flash memory 13 is a NAND flash memory, for example. Note that the memory included in the USB drive 10 is not limited to the NAND flash memory 13, and the USB drive 10 can also include a non-volatile memory of other types such as a NOR flash memory, an Magnetoresistive Random Access Memory (MRAM), a Phase change Random Access Memory (PRAM), a Resistive Random Access Memory (ReRAM), or a Ferroelectric Random Access Memory (FeRAM).

The controller 14 is mounted on the second mounting face 72b of the mounting portion 72. For example, a plurality of terminals of the controller 14 are electrically connected to a plurality of pads on the second mounting face 72b by soldering. The controller 14 may be mounted on the first mounting face 72a. The controller 14 is electrically connected to the terminal unit 75 and the flash memory 13 via a plurality of electrodes and wirings of the substrate 12, for example. The controller 14 controls the flash memory 13.

The flash memory 13 and the controller 14 are each away from the case 22. Air is interposed between the flash memory 13 and the case 22. Similarly, air is interposed between the controller 14 and the case 22. The air reduces the thermal conduction between the flash memory 13 and the controller 14, and the case 22. In other words, the air thermally insulates the flash memory 13 and the controller 14 from the case 22.

Figure 5:
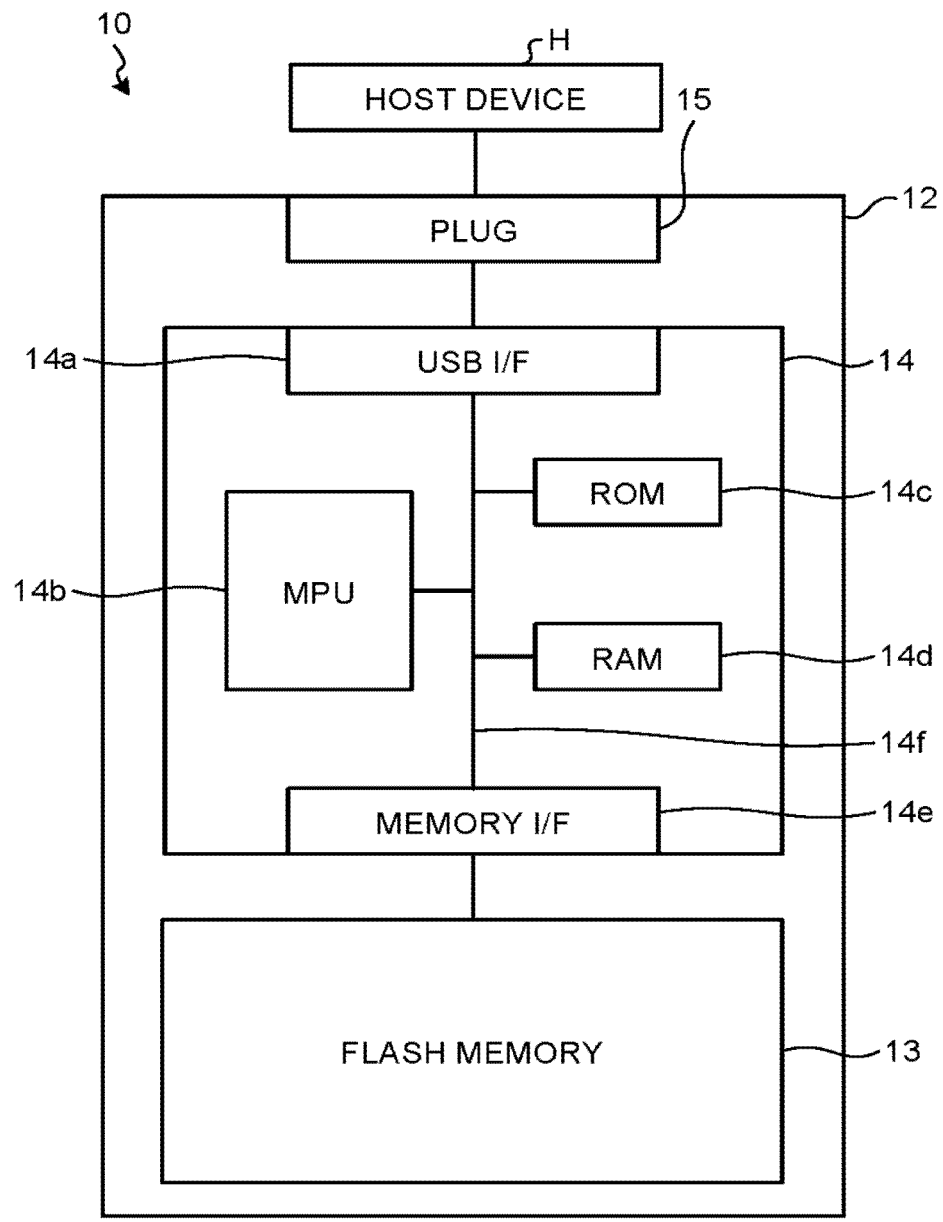
FIG. 5 is a block diagram illustrating an example of a configuration of the USB drive of the first embodiment.

FIG. 5 is a block diagram illustrating an example of a configuration of the USB drive 10 according to the first embodiment. As illustrated in FIG. 5, the controller 14 controls data transfer between the plug 15 and the flash memory 13. The controller 14 includes a USB interface (I/F) 14a, an MPU 14b, a ROM 14c, a RAM 14d, a memory interface (I/F) 14e, and an internal bus 14f. The USB I/F 14a, the MPU 14b, the ROM 14c, the RAM 14d, the memory I/F 14e, and the internal bus 14f are formed on a single semiconductor substrate, for example.

The USB I/F 14a receives data and a command from the host device H via the plug 15. The data and the command are described in accordance with the standard format of SCSI (Small Computer System Interface), for example. The USB I/F 14a outputs data read out from the flash memory 13 to the host device H via the plug 15 in accordance with the standard format of SCSI.

The MPU 14b processes the command received from the host device H and the data received from the flash memory 13 by using the ROM 14c and the RAM 14d, for example. The MPU 14b further performs an authentication process between the host device H and the USB drive 10 when the USB drive 10 is connected to the host device H.

The ROM 14c retains data, a program, and the like required for processing in the MPU 14b. The RAM 14d functions as a work region in the processing in the MPU 14b. For example, the RAM 14d is a volatile semiconductor memory, such as a DRAM.

For example, the memory I/F 14e is connected to the flash memory 13 by a plurality of wirings. In accordance with an instruction by the MPU 14b, the memory I/F 14e transfers the command and the data received in the USB I/F 14a to the flash memory 13 and transfers the data read out from the flash memory 13 to the USB I/F 14a.

The flash memory 13 reads out and outputs data in accordance with a read command given from the controller 14. The flash memory 13 records data therein in accordance with a write command given from the controller 14.

When the USB drive 10 described above is operated, the controller 14 and other electronic components mounted on the substrate 12 generate heat. For example, the heat generated from the controller 14 is conducted to wirings, the ground, and other portions of the mounting portion 72 of the substrate 12. The heat conducted to the mounting portion 72 of the substrate 12 from the controller 14 is conducted to the terminal portion 71.

As illustrated in FIG. 4, the third surface 71c and the fourth surface 71d of the terminal portion 71 are in contact with the first coating 41. The heat of the terminal portion 71 is conducted to the first coating 41. Further, the second coating 62 is in contact with the first surface 71a of the terminal portion 71 and the first coating 41. The heat of the terminal portion 71 is conducted to the first coating 41 via the second coating 62.

In the plug 15 inserted into the socket 80, the first coating 41 is in contact with at least a portion of the socket terminal portion 82. The heat of the first coating 41 is conducted to the host device H via the socket terminal portion 82. That is, the heat generated from the controller 14 is conducted to the socket 80 via the substrate 12 and the first coating 41.

In the USB drive 10 according to the first embodiment, the first coating 41 is interposed between the terminal portion 71 of the substrate 12 and the inner circumferential face 31 of the shell 21. The thermal conductivity of metal that is the material of the first coating 41 is higher than the thermal conductivity of synthetic resin that is the material of the shell 21. Therefore, the heat generated from the controller 14, for example, is conducted to the first coating 41 through the substrate 12. The heat is conducted to the host device H via the socket 80 into which the shell 21 is inserted, for example. Therefore, the USB drive 10 is cooled more efficiently, as compared with a case where the inner circumferential face 31 is not covered with the first coating 41. Further, because the first coating 41 is provided in the inner circumferential face 31 and is covered, the first coating 41 is prevented from impairing an appearance of the USB drive 10. Furthermore, the shell 21 is prevented from being broken because the first coating 41 reinforces the shell 21.

For example, the first coating 41 covers a portion of the shell 21 at which the first wall 34 and the second wall 35 are connected to each other. Due to this configuration, damage of the shell 21 caused by insertion or removal of the plug 15 to/from the socket 80 is suppressed.

For example, the first coating 41 covers a portion of the inner circumferential face 31 positioned on the opposite side of the depression 39. Due to this configuration, damage of the shell 21 is suppressed when the spring of the socket shell 81 is inserted into the depression 39.

The shell 21 is formed integrally with at least a portion of the outer face 53 of the case 22. In other words, the shell 21 and at least a portion of the outer face 53 of the case 22 are continuous. This makes a design of the USB drive 10 casual, for example, so that the appearance of the USB drive 10 is improved.

The shell 21 is formed integrally with the case 22. In other words, the shell 21 and the case 22 are continuous. This improves the appearance of the USB drive 10.

The first coating 41 is a substantially quadrangular hollow tube covering the inner circumferential face 31. As compared with a case where the first coating 41 covers any one of the first to fourth faces 31a, 31b, 31c, and 31d of the inner circumferential face 31, for example, an area of the first coating 41 is larger. Therefore, the heat generated from the controller 14 is radiated through the first coating 41 more efficiently, and the USB drive 10 is cooled more efficiently. Further, because the first coating 41 in form of a tube supports the shell 21, damage of the shell 21 is suppressed.

The first to fourth covering portions 41a, 41b, 41c, and 41d of the first coating 41 cover the first to fourth faces 31a, 31b, 31c, and 31d of the inner circumferential face 31. The first to fourth covering portions 41a, 41b, 41c, and 41d are mutually connected. For example, as compared with the case where the first coating 41 covers any one of the first to fourth faces 31a, 31b, 31c, and 31d of the inner circumferential face 31, the area of the first coating 41 is larger. Therefore, the heat generated from the controller 14 is radiated through the first coating 41 more efficiently, and the USB drive 10 is cooled more efficiently. Further, because the first to fourth covering portions 41a, 41b, 41c, and 41d support the shell 21, damage of the shell 21 is suppressed.

The first coating 41 is in contact with the terminal portion 71. Due to this configuration, the heat generated from the controller 14, for example, is more efficiently conducted from the terminal portion 71 of the substrate 12 to the first coating 41. Therefore, the USB drive 10 is cooled more efficiently.

The first coating 41 is in contact with the third surface 71c and the fourth surface 71d of the terminal portion 71. Due to this configuration, the heat generated from the controller 14, for example, is more efficiently conducted from the third face 71c and the fourth face 71d of the substrate 12 to the first coating 41. Therefore, the USB drive 10 is cooled more efficiently.

For example, because the first coating 41 is produced by electroless plating, the first coating 41 is made to adhere on the inner circumferential face 31. Due to this configuration, the first coating 41 supports the shell 21 and therefore damage of the shell 21 is suppressed.

The first coating 41 is thinner than the shell 21. This suppresses increase in thickness of the shell 21 caused by the first coating 41. Further, the first coating 41 is prevented from being noticeable, so that the first coating 41 is prevented from impairing the appearance of the USB drive 10.

The material of the shell 21 includes resin. Due to this configuration, for example, it is easy to freely set the color and shape of the shell 21, as compared with a case where the material of the shell 21 is metal. Therefore, the appearance of the USB drive 10 is improved.

The material of the first coating 41 includes metal. Metal is generally harder than resin and its thermal conductivity is higher than that of resin. Therefore, the USB drive 10 is cooled more efficiently. Further, the shell 21 is reinforced by the first coating 41, so that damage of the shell 21 is suppressed.

The first coating 41 is made of plating. This enables the first coating 41 to be formed to be thin, so that increase in the thickness of the shell 21 caused by formation of the first coating 41 is suppressed.

The first coating 41 may be a metal sleeve or a tube formed in advance by various types of methods such as casting or forging. In this case, the shell 21 and the case 22 are manufactured by insert molding. This enables the first coating 41 to be more easily formed. Further, the shell 21 is reinforced by the first coating 41, so that damage of the shell 21 is suppressed.

The second coating 62 covers at least a portion of the projection 61 interposed between the first coating 41 and the terminal portion 71. The thermal conductivity of metal that is the material of the second coating 62 is higher than the thermal conductivity of synthetic resin that is the material of the shell 21. The first contact portion 62a of the second coating 62 is in contact with the first coating 41. The second contact portion 62b is in contact with the terminal portion 71 and is thermally connected to the first contact portion 62a. Due to this configuration, the terminal portion 71 is thermally connected to the first coating 41 via the second coating 62. Therefore, in a case where the projection 61 is interposed between the first coating 41 and the terminal portion 71, lowering of the cooling efficiency of the USB drive 10 is suppressed.

The projection 61 is connected to the second cover 56. Due to this configuration, the projection 61 closes at least a portion of a portion at which the first cover 55 and the second cover 56 are connected to each other. This configuration prevents the substrate 12 from being exposed from the portion at which the first cover 55 and the second cover 56 are connected to each other in a case where the case 22 is twisted, for example.

The USB drive 10 includes the plug 15 configured to be inserted into the socket 80 of the USB standard. The plug 15 includes the shell 21 and the terminal portion 71. At least a portion of the inner circumferential face 31 of the shell 21 is covered by the first coating 41. Therefore, the heat generated from the controller 14 is conducted to the host device H via the socket 80, so that the USB drive 10 is cooled more efficiently.

The first coating 41 partly covers the inner circumferential face 31. Therefore, the first coating 41 is prevented from impairing the appearance of the USB drive 10. Further, the material cost of the first coating 41 is reduced.

The tip end portion 21b of the shell 21 is exposed without being covered by the first coating 41. Due to this configuration, the first coating 41 is prevented from impairing the appearance of the USB drive 10, and the exposed portion of the first coating 41 is prevented from peeling off from the shell 21.

The controller 14 is away from the case 22. The air between the controller 14 and the case 22 prevents the heat generated from the controller 14 from being conducted to the case 22. Therefore, the case 22 and the space 51 are prevented from being heated, and the flash memory 13 is prevented from being heated via the case 22.

Second Embodiment

A second embodiment is described below with reference to FIG. 6. In the plurality of embodiments described below, constituent elements having functions identical to those of the constituent elements described above are denoted with like reference signs of the corresponding constituent elements, and descriptions thereof may be omitted. Further, constituent elements denoted with like reference signs do not necessarily have completely common functions and characteristics to each other, and these elements can include different functions and characteristics according to the respective embodiments.

Figure 6:
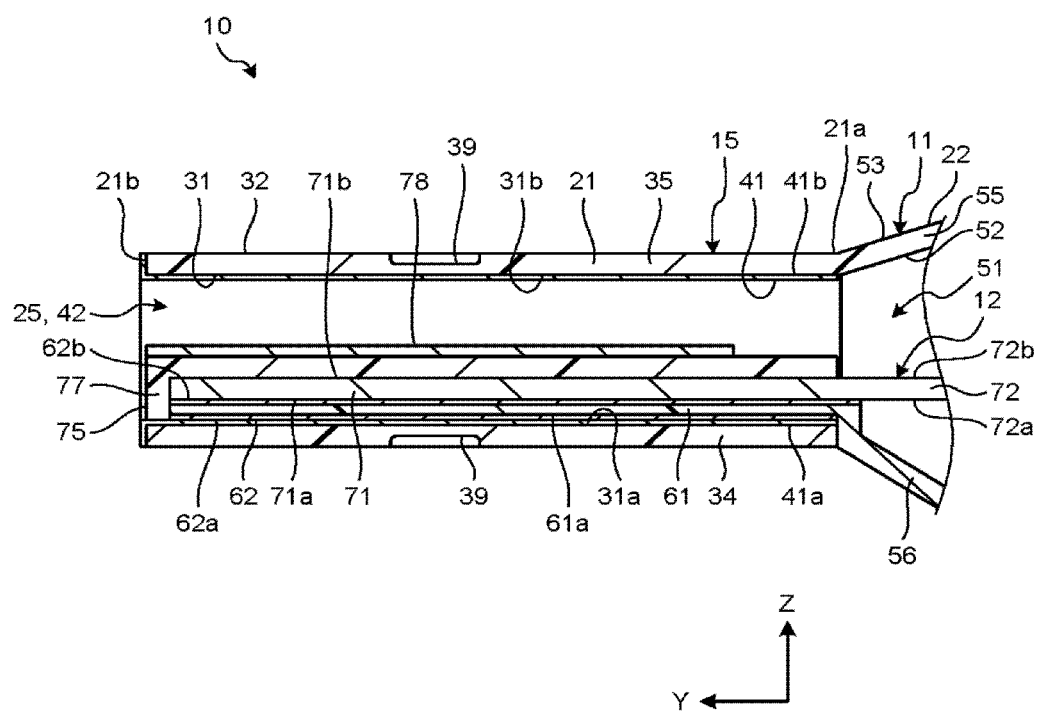
FIG. 6 is a cross-sectional view of a portion of a USB drive according to a second embodiment.

FIG. 6 is a cross-sectional view of a portion of the USB drive 10 according to the second embodiment. As illustrated in FIG. 6, the first coating 41 according to the second embodiment further covers the tip end portion 21b of the shell 21. The first coating 41 may cover a portion of the tip end portion 21b or may cover the tip end portion 21b entirely.

In the USB drive 10 according to the second embodiment, the first coating 41 further covers at least a portion of the tip end portion 21b of the shell 21. Therefore, an area of the first coating 41 is increased. Further, the first coating 41 covering the tip end portion 21b may be in contact with the socket 80 into which the shell 21 is inserted, for example. Due to this configuration, the heat generated from the controller 14 is conducted to the host device H, for example, more efficiently through the first coating 41. Therefore, the USB drive 10 is cooled more efficiently.

Third Embodiment

Figure 7:
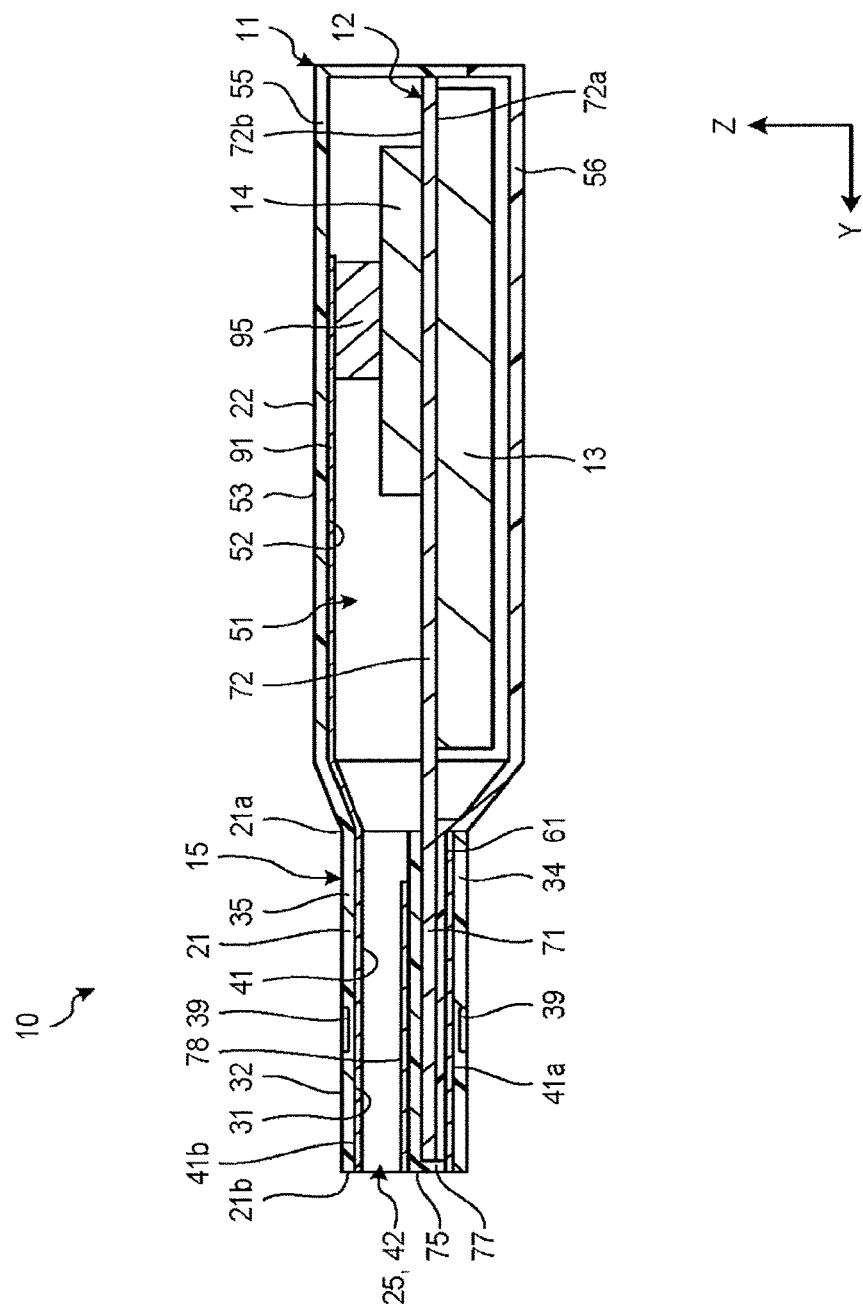
FIG. 7 is a cross-sectional view illustrating a USB drive according to a third embodiment.

A third embodiment is described below with reference to FIG. 7. FIG. 7 is a cross-sectional view illustrating the USB drive 10 according to the third embodiment. As illustrated in FIG. 7, the first coating 41 further includes an extending portion 91.

The extending portion 91 extends from the second covering portion 41b of the first coating 41 to partly cover the inner face 52 of the case 22. One end portion of the extending portion 91 is connected to the second covering portion 41b. The other end portion of the extending portion 91 is provided at a position opposed to the controller 14.

An area of a portion of the inner face 52, covered by the extending portion 91, is smaller than an area of a portion of the inner face 52, not covered by the extending portion 91. Further, an area of the extending portion 91 is smaller than a total of areas of the first to fourth covering portions 41a, 41b, 41c, and 41d.

The extending portion 91 is thermally connected to the controller 14 by a heat transfer member 95. The heat transfer member 95 is made of thermally conductive acrylic resin or grease, for example. The thermal conductivity of the heat transfer member 95 is higher than the thermal conductivity of the case 22.

As described in the first embodiment, the controller 14 is thermally connected to the first coating 41 via the substrate 12. Further, the controller 14 according to the present embodiment is thermally connected to the first coating 41 via the heat transfer member 95.

The heat generated from the controller 14 is conducted to the first to fourth covering portions 41a, 41b, 41c, and 41d of first coating 41 through a first path including the substrate 12 and a second path including the heat transfer member 95 and the extending portion 91. The heat in the first to fourth covering portions 41a, 41b, 41c, and 41d is conducted to the host device H via the socket terminal portion 82.

In the USB drive 10 according to the third embodiment, the first coating 41 partly covers the inner face 52 of the case 22 and is thermally connected to the controller 14. Due to this configuration, the heat generated from the controller 14 is conducted to the first to fourth covering portions 41a, 41b, 41c, and 41d of the shell 21 through the extending portion 91 of the case 22. Therefore, the USB drive 10 is cooled more efficiently.

Fourth Embodiment

Figure 8:
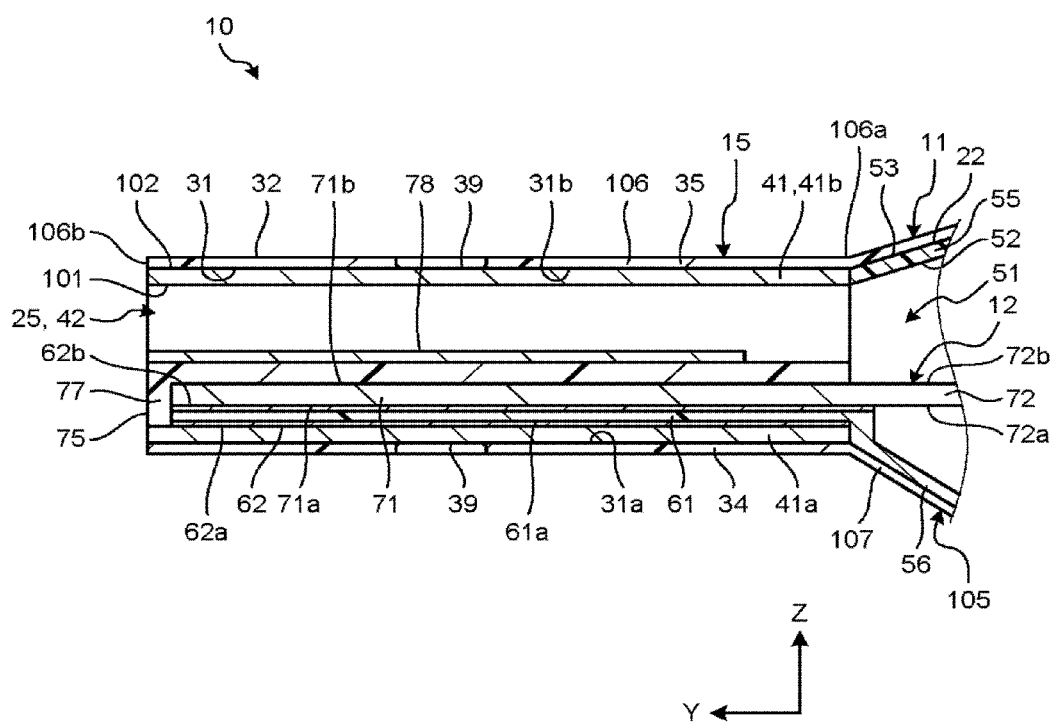
FIG. 8 is a cross-sectional view of a portion of a USB drive according to a fourth embodiment.

A fourth embodiment is described below with reference to FIG. 8. FIG. 8 is a cross-sectional view of a portion of the USB drive 10 according to the fourth embodiment. In the fourth embodiment, the first coating 41 is a metal sleeve or a tube formed in advance by various types of methods such as casting or forging. The first coating 41 is mounted on the substrate 12.

The first coating 41 has an inner circumferential face 101 and an outer circumferential face 102. The inner circumferential face 101 forms an inner opening 42. In other words, the inner circumferential face 101 faces the inner opening 42. The outer circumferential face 102 is positioned on the opposite side of the inner circumferential face 101.

The housing 11 according to the fourth embodiment includes a third coating 105 in place of the shell 21. For example, the third coating 105 is made of paint. The third coating 105 may be made of other materials such as resin.

The third coating 105 that is paint is applied onto the outer circumferential face 102 of the first coating 41 and the outer face 53 of the case 22. The third coating 105 that is resin may be cover the outer circumferential face 102 of the first coating 41 and the outer face 53 of the case 22 by insert molding, for example.

The third coating 105 includes a shell portion 106 and a case portion 107. The shell portion 106 is an example of the first tube. The case portion 107 is an example of an outer face of a case. The shell portion 106 and the case portion 107 are formed integrally with each other.

The shell portion 106 covers the outer circumferential face 102 of the first coating 41. Therefore, the shell portion 106 of the third coating 105 forms a surface of the plug 15. The shell portion 106 is a substantially quadrangular hollow tube. The shell portion 106 has a substantially cuboidal shape and is provided with the opening 25 extending in the direction along the Y-axis, like the shell 21 in the first embodiment.

The shell portion 106 includes a base end portion 106a and a tip end portion 106b. The base end portion 106a is an example of the first end portion. The tip end portion 106b is an example of the second end portion. The base end portion 106a is one end portion of the shell portion 106 in the direction along the Y-axis, and is connected to the case portion 107. The tip end portion 106b is the other end portion of the shell portion 106 in the direction along the Y-axis and is positioned on the opposite side of the base end portion 106a. An end portion of the first coating 41 is exposed. The tip end portion 106b of the shell portion 106 may cover the end portion of the first coating 41.

The opening 25 extends from the base end portion 106a of the shell portion 106 toward the tip end portion 106b and extends to pass through the shell portion 106. In other words, the opening portion 25 is open to the base end portion 106a and is also open to the tip end portion 106b.

The shell portion 106 has the inner circumferential face 31, the outer circumferential face 32, the first wall 34, the second wall 35, the third wall 36, and the fourth wall 37, like the shell 21 in the first embodiment. At least a portion of the inner circumferential face 31 of the shell portion 106 is covered by the first coating 41. The inner circumferential face 31 of the shell portion 106 is made to adhere on the outer circumferential face 102 of the first coating 41.

The case portion 107 covers the outer face 53 of the case 22. Therefore, the case portion 107 of the third coating 105 forms a surface of the case 22. The surface of the case 22 formed by the case portion 107 is continuous with the surface of the plug 15 formed by the shell portion 106.

In the USB drive 10 according to the fourth embodiment, the shell portion 106 of the third coating 105 is formed integrally with the case portion 107 forming the outer face of the case 22. In other words, the surface of the case 22 formed by the case portion 107 is continuous with the surface of the plug 15 formed by the shell portion 106. This improves the appearance of the USB drive 10.

The first to fourth embodiments describe the USB drive 10 in which the flash memory 13 and the controller 14 are mounted on the substrate 12. However, the USB drive 10 may be a USB drive of Chip on Board (CoB) type or of System in a Package (SiP) type.

According to at least one of the embodiments described above, a first layer is interposed between a first portion of a substrate and a first inner face of a first tube. The thermal conductivity of a second material of the first layer is higher than the thermal conductivity of a first material of the first tube. Therefore, a semiconductor memory device is cooled more efficiently.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first tube which includes an inner face and has a first thermal conductivity;
   a case connected to the first tube;
   a substrate which includes a first portion inside the first tube, on which an electrode is mounted, and a second portion inside the case;
   a memory mounted on the substrate;
   a controller mounted on the substrate and configured to control the memory; and
   a first layer which is interposed between the first portion of the substrate and the inner face of the first tube, is in contact or covered with at least a portion of the inner face of the first tube, and has a second thermal conductivity higher than the first thermal conductivity of the first tube.

2. The semiconductor memory device according to claim 1, wherein
   the case includes an inner surface facing the second portion and an outer face on an opposite side of the inner surface, and
   the first tube is formed integrally with at least a portion of the outer face of the case.

3. The semiconductor memory device according to claim 2, wherein the first tube is formed integrally with the case.

4. The semiconductor memory device according to claim 3, wherein the first layer includes a second tube covering the inner face of the first tube.

5. The semiconductor memory device according to claim 3, wherein
   the inner face of the first tube includes a first face, a second face facing the first face, a third face connecting one end of the first face and one end of the second face to each other, and a fourth face connecting the other end of the first face and the other end of the second face to each other,
   the first layer includes a first covering portion covering the first face, a second covering portion covering the second face, a third covering portion covering the third face, and a fourth covering portion covering the fourth face, and
   the first covering portion, the second covering portion, the third covering portion, and the fourth covering portion are mutually connected.

6. The semiconductor memory device according to claim 5, wherein a portion of the first layer is in contact with the first portion.

7. The semiconductor memory device according to claim 6, wherein
   the first portion includes a first surface, a second surface positioned on an opposite side of the first surface, a third surface connecting one end of the first surface and one end of the second surface to each other, and a fourth surface connecting the other end of the first surface and the other end of the second surface to each other,
   the second surface is opposed to the second face, the electrode mounted on the second surface, and
   the first layer is in contact with the third surface.

8. The semiconductor memory device according to claim 7, wherein the first layer is made to adhere on the inner face of the first tube.

9. The semiconductor memory device according to claim 8, wherein the first layer is thinner than the first tube.

10. The semiconductor memory device according to claim 9, wherein the first tube includes resin.

11. The semiconductor memory device according to claim 10, wherein the first layer includes metal.

12. The semiconductor memory device according to claim 11, further comprising:
    a member interposed between the first layer and the first portion; and
    a second layer covering at least a portion of the member, including a first contact portion which is in contact with the first layer and a second contact portion which is in contact with the first portion and is thermally connected to the first contact portion, and having a third thermal conductivity higher than the first thermal conductivity of the first tube.

13. The semiconductor memory device according to claim 12, wherein
    the case includes a first cover which is provided with a space in which the second portion is arranged and is connected to the first tube, and a second cover configured to close the space by being attached to the first cover, and
    the member is connected to the second cover.

14. The semiconductor memory device according to claim 13, further comprising a connector which includes the first tube and the first portion and is configured to be inserted into a female connector conforming to a USB standard.

15. The semiconductor memory device according to claim 14, wherein the first tube includes a first end portion connected to the case and a second end portion which is positioned on an opposite side of the first end portion in a direction from the second portion towards the first portion and is not covered by the first layer.

16. A semiconductor memory device being connectable to a host device including a socket which includes a terminal and conforms to a Universal Serial Bus (USB) standard, the semiconductor memory device comprising:
    a USB connector being insertable into the socket;
    a substrate including a first portion on which an electrode is mounted and a second portion on which a non-volatile memory and a controller controlling the non-volatile memory are mounted, the electrode being in contact with the terminal when the USB connector is inserted into the socket; and
    a case accommodating the second portion of the substrate therein, wherein
    the USB connector includes a tube and a layer,
    the tube accommodates the first portion of the substrate therein, includes an inner face, has a first thermal conductivity, and is connected to the case, and
    the layer is interposed between the first portion of the substrate and the inner face of the tube, is in contact or covered with at least a portion of an inner face of the tube, and has a second thermal conductivity higher than the first thermal conductivity of the tube.

17. The semiconductor memory device according to claim 16, wherein the inner face of the tube includes a first face, a second face facing the first face, a third face connecting one end of the first face and one end of the second face to each other, and a fourth face connecting the other end of the first face and the other end of the second face to each other, and the layer includes a first covering portion covering the first face, a second covering portion covering the second face and being opposed to the electrode, a third covering portion covering the third face, and a fourth covering portion covering the fourth face, and the first covering portion, the second covering portion, the third covering portion, and the fourth covering portion are mutually connected.

18. The semiconductor memory device according to claim 17, wherein the layer is thinner than the tube.

19. The semiconductor memory device according to claim 18, wherein the tube is made of resin and the layer is made of metal.

20. The semiconductor memory device according to claim 19, wherein the layer is in contact with the first portion.

* * * * *